(12) United States Patent
Suzuki et al.

(10) Patent No.: US 7,199,692 B2
(45) Date of Patent: Apr. 3, 2007

(54) NOISE SUPPRESSOR

(75) Inventors: Mitsunari Suzuki, Tokyo (JP);
Noriyuki Hirabayashi, Tokyo (JP);
Yoshihiro Saitoh, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/367,394

(22) Filed: Mar. 6, 2006

(65) Prior Publication Data

US 2006/0220772 A1 Oct. 5, 2006

(30) Foreign Application Priority Data

Mar. 31, 2005 (JP) ............................. 2005-101199

(51) Int. Cl.
*H01F 27/28* (2006.01)
(52) U.S. Cl. .................................... 336/170
(58) Field of Classification Search ................ 336/65,
336/83, 170, 180–185, 214–215, 174–175;
333/181–185; 331/117 R
See application file for complete search history.

(56) References Cited

U.S. PATENT DOCUMENTS

| | | | | |
|---|---|---|---|---|
| 4,888,675 A | * | 12/1989 | Kumar et al. | 363/47 |
| 4,999,594 A | * | 3/1991 | Ingman | 333/181 |
| 5,278,526 A | * | 1/1994 | Ikeda | 333/185 |
| 5,475,346 A | * | 12/1995 | Mullett | 333/25 |
| 5,920,468 A | * | 7/1999 | Brisson et al. | 363/39 |
| 6,476,689 B1 | * | 11/2002 | Uchida et al. | 333/177 |
| 6,847,530 B2 | * | 1/2005 | James | 363/39 |

FOREIGN PATENT DOCUMENTS

JP         A 10-256859          3/2006

* cited by examiner

*Primary Examiner*—Tuyen T. Nguyen
(74) *Attorney, Agent, or Firm*—Oliff & Berridge, PLC (57) ABSTRACT

A noise suppressor capable of obtaining a favorable attenuation characteristic even in the case where a plurality of inductors on a conductive wire are magnetically coupled to each other. The noise suppressor includes a first inductor and a second inductor which are magnetically coupled to each other on a first conductive wire, a third inductor having one end connected to the other end of a first capacitor and the other end of a second capacitor and the other end connected to ground, and a fourth inductor and a fifth inductor which are magnetically coupled to each other on a second conductive wire. While it is considered that the coupling coefficients k1 through k6 between the inductors are smaller than 1 in reality, in particular, on the basis of the condition that the coupling coefficients K1 through k6 are smaller than 1, the inductance of the third inductor is set to a value corresponding to the actual values of the coupling coefficients k1 through k6 so as to obtain a desired noise attenuation characteristic.

7 Claims, 7 Drawing Sheets

NOISE SUPPRESSOR

BACKGROUND OF THE INVENTION

1. Field of the Invention

The present invention relates to a noise suppressor which suppresses noise transmitted through a first conductive wire and a second conductive wire.

2. Description of the Related Art

Power electronics devices such as switching power supplies, inverters, lighting circuits for lighting fixtures include a power converter circuit which converts power. The power converter circuit includes a switching circuit which converts a direct current into an alternating current with a rectangular wave. Therefore, the power converter circuit produces a ripple voltage with a frequency equivalent to the switching frequency of the switching circuit or noise associated with the switching operation of the switching circuit. The ripple voltage or noise adversely affects other devices. Therefore, it is necessary to arrange a means for reducing the ripple voltage or noise between the power converter circuit and the other devices or lines.

Moreover, recently as a communications technology used for the establishment of a home communication network, power line communications holds promise, and the development of the power line communications has been advanced. In the power line communications, a high frequency signal is superimposed on a power line to establish communication. In the power line communications, noise is produced on the power line by the operations of various electrical and electronic devices connected to the power line, and the noise causes a decline in communication quality such as an increase in error rate. Therefore, a means for reducing noise on the power line is necessary. Moreover, in the power line communications, it is necessary to prevent a communication signal on an indoor power line from being leaked to an outdoor power line.

Noise transmitted through two conductive wires includes normal mode (differential mode) noise which causes a potential difference between two conductive wires and common mode noise transmitted through two conductive wires at the same phase.

Arranging a line filter on a power supply line, a signal line or the like is effective in suppressing the noise. In Japanese Unexamined Patent Application Publication No. H10-256859, an AC line filter which removes noise on an AC power line is disclosed. The AC line filter includes a phase reversal transformer for normal mode suppression and two common mode chokes. In other words, the AC line filter includes a plurality of inductors on the same line.

SUMMARY OF THE INVENTION

In a line filter, a large current flows through an inductor on a line, so it is desirable that an inductor with a small number of turns can obtain a large inductance. When the inductor with a small number of turns can obtain a large inductance, the inductor with a large inductance can contribute to downsizing of the inductor. Therefore, it can be considered that inductors on the line are magnetically coupled to each other so as to increase inductance. In this case, in order to obtain a favorable attenuation characteristic, it is desirable that the line filter has an appropriate circuit structure with consideration given to the extent of magnetic coupling. In Japanese Unexamined Patent Application Publication No. H10-256859, a circuit structure with consideration given to the extent of magnetic coupling is not disclosed.

In view of the foregoing, it is desirable to provide a noise suppressor capable of obtaining a favorable attenuation characteristic even in the case where a plurality of inductors on a current-carrying line are magnetically coupled to each other.

According to a first embodiment, a second embodiment and a third embodiment of the invention, there is provided a noise suppressor suppressing noise transmitted through a first conductive wire and a second conductive wire, the noise suppressor including: a first inductor and a second inductor which are inserted into the first conductive wire in series with each other and are magnetically coupled to each other; a first capacitor which has one end connected between the first inductor and the second inductor; a third inductor which has one end connected to the other end of the first capacitor and the other end connected to ground, and forms a first series circuit together with the first capacitor; a fourth inductor and a fifth inductor which are inserted into the second conductive wire in series with each other, and are magnetically coupled to each other; and a second capacitor which has one end connected between the fourth inductor and the fifth inductor and the other end connected to one end of the third inductor, and forms a second series circuit together with the third inductor, wherein a pair of the first and the second inductors and a pair of the fourth and the fifth inductors are magnetically coupled to each other.

In particular, in the noise suppressor according to the first embodiment, the inductance $L3$ of the third inductor satisfies the following condition:

$$L3 = (M1 + M5)/2 \qquad (A\text{-}1),$$

where $M1 = k1(L1 \cdot L2)^{1/2}$, $M5 = k5(L1 \cdot L5)^{1/2}$, $L1$: inductance of the first inductor,
$L2$: inductance of the second inductor,
$L5$: inductance of the fifth inductor,
$k1$: coupling coefficient between the first and the second inductor, and
$k5$: coupling coefficient between the first and the fifth inductor.

In the noise suppressor according to the second embodiment of the invention, the inductance $L3$ of the third inductor satisfies the following conditions:

$$L3 > (M1+M5)/2 \qquad (B\text{-}1), \text{ and}$$

$$L3 \leq (L1+M1+M3+M5)(L2+M1+M4+M5)/2(L1+L2+ \\ 2 \cdot M1+M3+M4+2 \cdot M5)+(M1+M5)/2,$$

where $M1 = k1(L1 \cdot L2)^{1/2}$, $M3 = k3(L1 \cdot L4)^{1/2}$, $M4 = k4(L2 \cdot L5)^{1/2}$, $M5 = k5(L1 \cdot L5)^{1/2}$, $L1$: inductance of the first inductor,
$L2$: inductance of the second inductor,
$L4$: inductance of the fourth inductor,
$L5$: inductance of the fifth inductor,
$k1$: coupling coefficient between the first and the second inductors,
$k3$: coupling coefficient between the first and the fourth inductor, k4: coupling coefficient between the second and the fifth inductor, and k5: coupling coefficient between the first and the fifth inductor.

In the noise suppressor according to the third embodiment of the invention, the inductance L3 of the third inductor satisfies the following conditions:

$$L3<(M1+M5)/2 \qquad \text{(C-1), and}$$

$$L3 \geq 0.9(M1+M5)/2,$$

where $M1=k1(L1 \cdot L2)^{1/2}$, $$M5=k5(L1 \cdot L5)^{1/2},$$

L1: inductance of the first inductor,

L2: inductance of the second inductor,

L5: inductance of the fifth inductor, k1: coupling coefficient between the first and the second inductor, and k5: coupling coefficient between the first and the fifth inductor.

In the noise suppressors according to the first embodiment, the second embodiment and the third embodiment of the invention, circuit conditions which is suitable for obtaining a desired noise attenuation characteristic, are set, so even if the coupling coefficient k1 between the first and the second inductors, the coupling coefficient k2 between the fourth and the fifth inductors, the coupling coefficient k3 between the first and the fourth inductors, the coupling coefficient k4 between the second and the fifth inductors, the coupling coefficient k5 between the first and the fifth inductors and the coupling coefficient k6 between the second and the fourth inductors are smaller than 1, with regard to a frequency characteristic of noise attenuation, for example, a characteristic which is substantially the same as or similar to that in an ideal state can be obtained, or a better characteristic than that in the ideal state can be obtained partially.

In this case, the ideal state means a state in which the inductances L1 through L5 of the first through the fifth inductors are optimized assuming that the coupling coefficients k1 through k6 are 1. For example, the ideal state means a state in which the inductances L1 and L2 of the first and the second inductors and the inductances L4 and L5 of the fourth and the fifth inductors are the same values L0, and the inductance L3 of the third inductor is the same value L0.

In particular, in the noise suppressor according to the first embodiment of the invention, with regard to the frequency characteristic of noise attenuation, substantially the same characteristic as that in the ideal state can be obtained.

Moreover, in particular, in the noise suppressor according to the second embodiment of the invention, with regard to the frequency characteristic of noise attenuation, a resonance point which does not exist in the ideal state can be obtained. Thereby, in a higher frequency region than the resonance point, a region in which the attenuation characteristic is better than that in the ideal state is produced partially.

Further, in particular, in the noise suppressor according to the third embodiment of the invention, with regard to the frequency characteristic of noise attenuation, a characteristic similar to that in the ideal state is obtained, and in particular, substantially the same characteristic as that in the ideal state is shown until a certain state. Therefore, when the noise suppressor is used in substantially the same frequency range as that in the ideal state, there is a merit in setting L3 to the condition value.

The noise suppressors according to the first, the second and the third embodiments of the invention preferably satisfy the following conditions, and the relationship between the inductors on the first conductive wire and the inductors on the second conductive wire is preferably symmetric. Thereby, a circuit suitable for common mode noise suppression can be obtained. However, it is not necessary to perfectly satisfy the following conditions, and there may be a difference by a manufacturing error.

L1=L4
L2=L5
k1=k2
k5=k6 where L1: inductance of the first inductor,

L2: inductance of the second inductor,

L4: inductance of the fourth inductor, and

L5: inductance of the fifth inductor.

According to a fourth embodiment of the invention, there is provided a noise suppressor suppressing noise transmitted through a first conductive wire and a second conductive wire, the noise suppressor including: a first inductor and a second inductor which are inserted into the first conductive wire in series with each other and are magnetically coupled to each other; a first capacitor which has one end connected between the first inductor and the second inductor; a third inductor which has one end connected to the other end of the first capacitor and the other end connected to ground, and forms a first series circuit together with the first capacitor; a fourth inductor and a fifth inductor which are inserted into the second conductive wire in series with each other, and are magnetically coupled to each other; and a second capacitor which has one end connected between the fourth inductor and the fifth inductor and the other end connected to one end of the third inductor, and forms a second series circuit together with the third inductor, wherein a pair of the first and the second inductors and a pair of the fourth and the fifth inductors are magnetically separated from each other.

In the noise suppressor according to the fourth embodiment of the invention, circuit conditions which is suitable for a desired noise attenuation characteristic are set, so even if the coupling coefficient k1 between the first and the second inductors and the coupling coefficient k2 between the fourth and the fifth inductors are smaller than 1, with regard to a frequency characteristic of noise attenuation, a characteristic which is substantially the same as or similar to the characteristic in an ideal state can be obtained, or a better characteristic than that in the ideal state can be obtained partially.

In this case, the ideal state means a state in which the inductances L1 through L5 of the first through the fifth inductors are optimized assuming that the coupling coefficients k1 through k6 are 1. For example, the ideal state means a state in which the inductances L1 and L2 of the first and the second inductors and the inductances L4 and L5 of the fourth and the fifth inductors are the same values L0, and the inductance L3 of the third inductor is the same value L0.

In the noise suppressor according to the fourth embodiment of the invention, in particular, in the case where the inductance L3 of the third inductor satisfies the following condition, with regard to the frequency characteristic of noise attenuation, substantially the same characteristic as that in the ideal state can be obtained.

$$L3=M1/2 \qquad \text{(A-2)}$$

where $M1=k1(L1 \cdot L2)^{1/2}$,

L1: inductance of the first inductor,

L2: inductance of the second inductor, and k1: coupling coefficient between the first and the second inductor.

Moreover, in particular, in the case where the inductance L3 of the third inductor satisfies the following conditions, with regard to the frequency characteristic of noise attenuation, a resonance point which does not exist in the ideal state can be obtained. Thereby, in a higher frequency region than the resonance point, a region in which the attenuation characteristic is better than that in the ideal state is produced partially.

The inductance L3 of the third inductor satisfies:

$$L3 > M1/2 \quad \text{(B-2), and}$$

$$L3 \leq (L1+M1)(L2+M1)/2(L1+L2+2 \cdot M1)+M1/2,$$

where $M1 = k1(L1 \cdot L2)^{1/2}$,

L1: inductance of the first inductor,
L2: inductance of the second inductor, and
k1: coupling coefficient between the first and the second inductors.

Further, in particular, in the case where the inductance L3 of the third inductor satisfies the following conditions, with regard to the frequency characteristic of noise attenuation, a characteristic similar to that in the ideal state can be obtained, and in particular, substantially the same characteristic as that in the ideal state is shown until a certain state. Therefore, when the noise suppressor is used in substantially the same frequency range as that in the ideal state, there is a merit in setting L3 to the condition value.

The inductance L3 of the third inductor satisfies:

$$L3 < M1/2 \quad \text{(C-2), and}$$

$$L3 \geq 0.9 \cdot M1/2,$$

where $M1 = k1(L1 \cdot L2)^{1/2}$,

L1: inductance of the first inductor,
L2: inductance of the second inductor, and
k1: coupling coefficient between the first and the second inductors.

The noise suppressors according to the fourth embodiment of the invention preferably satisfy the following conditions, and the relationship between the inductors on the first conductive wire and the inductors on the second conductive wire is preferably symmetric. Thereby, a circuit suitable for common mode noise suppression can be obtained. However, it is not necessary to perfectly satisfy the following conditions, and there may be a difference by a manufacturing error.

L1=L4
L2=L5
k1=k2 where L1: inductance of the first inductor;
L2: inductance of the second inductor;
L4: inductance of the fourth inductor; and
L5: inductance of the fifth inductor.

In the noise suppressor according to each embodiment of the invention, a suitable circuit structure with consideration given to a magnetic coupling state between a plurality of inductors on a conductive wire is satisfied, so even if the plurality of inductors on the conductive wire are magnetically coupled to each other, a favorable attenuation characteristic can be obtained.

Other and further objects, features and advantages of the invention will appear more fully from the following description.

DETAILED DESCRIPTION OF THE PREFERRED EMBODIMENTS

Preferred embodiments will be described in detail below referring to the accompanying drawings.

[First Embodiment]

Figure 1:
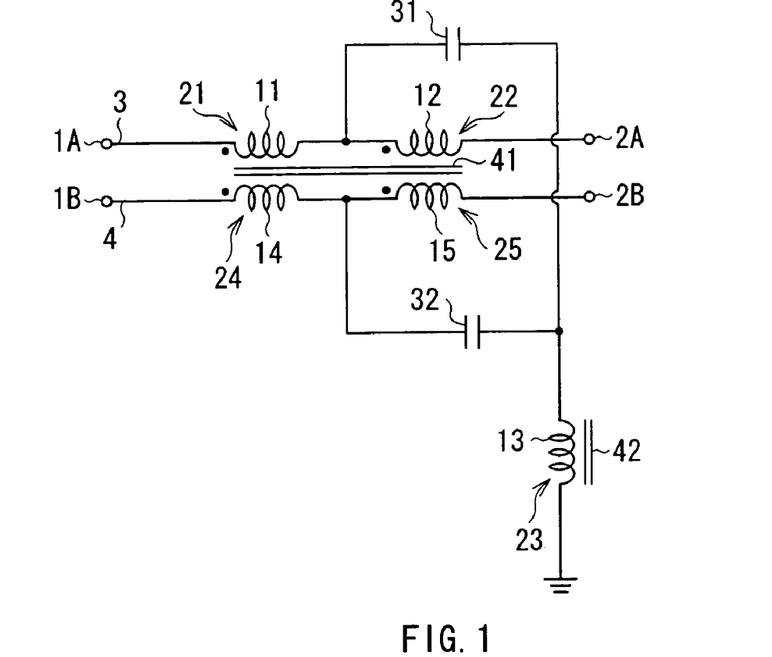
FIG. 1 is a circuit diagram of a noise suppressor according to a first embodiment of the invention.

At first, a noise suppressor according to a first embodiment of the invention will be described below. FIG. 1 shows an example of the noise suppressor according to the embodiment. The noise suppressor relates to a circuit for common mode suppression.

The noise suppressor includes a pair of terminals 1A and 1B, another pair of terminals 2A and 2B, a first conductive wire 3 which establishes connection between the terminals 1A and 2A, and a second conductive wire 4 which establishes connection between the terminals 1B and 2B. The noise suppressor further includes a first inductor 21 and a second inductor 22 which are inserted into the first conductive wire 3 in series with each other and are magnetically coupled to each other, a first capacitor 31 which has one end connected between the first inductor 21 and the second inductor 22, and a third inductor which has one end connected to the other end of the first capacitor 31 and the other end connected to ground, and forms a first series circuit together with the first capacitor 31. The noise suppressor further includes a fourth inductor 24 and a fifth inductor 25 which are inserted into the second conductive, wire 4 in series with each other and are magnetically coupled to each other, and a second capacitor which has one end connected between the fourth inductor 24 and the fifth inductor 25 and the other end connected to one end of the third inductor 23, and forms a second series circuit together with the third inductor 23. The first capacitor 31 and the second capacitor 32 form the first and the second series circuits in a state where the third inductor 23 is shared between the first capacitor 31 and the second capacitor 32.

The first and the second inductors 21 and 22 include a first winding wire 11 and a second winding wire 12, respectively. The third inductor 23 is formed through winding a third winding wire 13 around a core 42. The fourth and the fifth inductors 24 and 25 include a fourth winding wire 14 and a fifth winding wire 15, respectively. The first and the second capacitors 31 and 32 function as a high-pass filter through which a common mode signal with a predetermined frequency or higher passes.

The noise suppressor includes a core 41 around which the first and the second winding wires 11 and 12 and the fourth and fifth winding wires 14 and 15 are commonly wound. On the first conductive wire 3, the first inductor 21 and the second inductor 22 are formed of the first and the second winding wires 11 and 12 and the core 41 around which the first and the second winding wires 11 and 12 are commonly wound in each winding wire portion. Likewise, on the second conductive wire 4, the fourth inductor 24 and the fifth inductor 25 are formed of the fourth and the fifth winding wires 14 and 15 and the core 41 around which the fourth and the fifth winding wires 14 and 15 are commonly wound in each winding wire portion. Each inductor is formed through the use of the same common core 41, so they are magnetically coupled to one another. In the drawing, a black circle symbol shown in each winding wire indicates the polarity of the winding wire, that is, a winding direction. The polarities of the first and the second winding wires 11 and 12 are preferably in the same direction. The polarities of the fourth and the fifth winding wires 14 and 15 are preferably in the same direction.

The inductances of the first and the second inductors 21 and 22 are preferably the same. Likewise, the inductances of the fourth and the fifth inductors 24 and 25 are preferably the same. The first and the second inductors 21 and 22 and the fourth and the fifth inductors 24 and 25 suppress common mode noise in cooperation.

As long as the inductors are magnetically coupled appropriately, the core 41 may be divided into two or more. The first and the second inductors 21 and 22 may be made of a single winding wire instead of separate winding wires. The fourth and the fifth inductors 24 and 25 may be made of a single winding wire instead of separate winding wires. In this case, one end of the first capacitor 31 and one end of the second capacitor 32 are connected to somewhere in the middle of the single winding wire (preferably the midpoint of the single winding wire).

Figure 2:
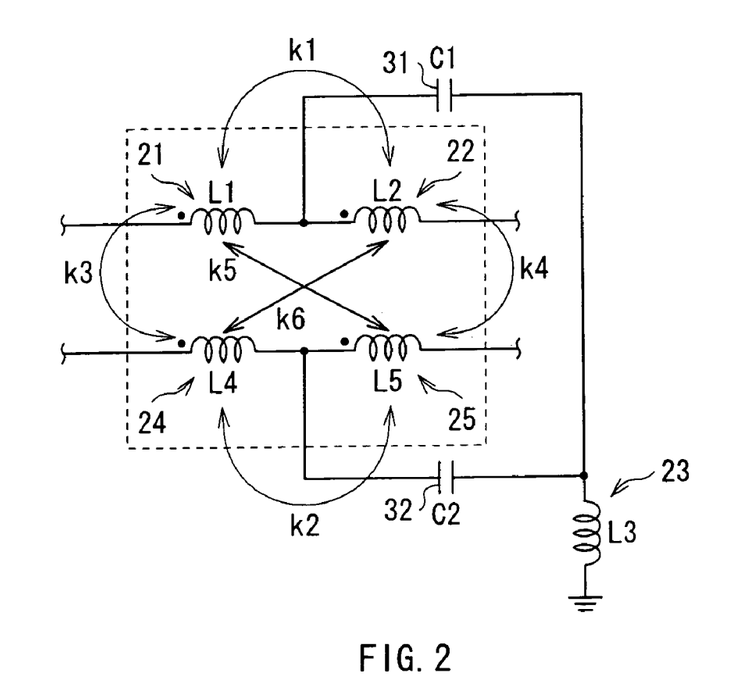
FIG. 2 is an illustration for describing coupling coefficients i between inductors in the noise suppressor according to the first embodiment of the invention.

Referring to FIG. 2, the circuit conditions of the noise suppressor will be described below.

As shown in FIG. 2, the inductance of the first inductor 21 is L1, the inductance of the second inductor 22 is L2, the inductance of the third inductor 23 is L3, the inductance of the fourth inductor 24 is L4, and the inductance of the fifth inductor 25 is L5. Moreover, the capacitance of the first capacitor 31 is C1, and the capacitance of the second capacitor 32 is C2. Further, the coupling coefficient between the first and the second inductors 21 and 22 is k1, the coupling coefficient between the fourth and the fifth inductors 24 and 25 is k2, the coupling coefficient between the first and the fourth inductors 21 and 24 is k3, the coupling coefficient between the second and the fifth inductors 22 and 25 is k4, the coupling coefficient between the first and the fifth inductor 21 and 25 is k5, and the coupling coefficient between the second and the fourth inductors 22 and 24 is k6.

It is preferable that the noise suppressor satisfies the following conditions, and a relationship between the inductors on the first conductive wire 3 and the inductors on the second conductive wire 4 is symmetric. Thereby, a circuit suitable for suppressing common mode noise can be obtained. However, it is not necessary for the noise suppressor to perfectly satisfy the following conditions, and there may be a difference by a manufacturing error.

L1=L4
L2=L5
k1=k2
k5=k6

In the noise suppressor, a pair of the first and the second inductors 21 and 22 and a pair of the fourth and the fifth inductors 24 and 25 are magnetically coupled to each other, and the ideal values of the coupling coefficients k1 through k6 are 1. However, in reality, it is difficult to achieve a coupling coefficient of 1. Even in a state where a coupling state is relatively good, the coupling coefficient is approximately 0.998. Moreover, the coupling coefficient is affected and reduced by the material of the core, the number of turns, the winding method or the like. For example, the smaller the number of turns is, the more easily the coupling coefficient is reduced. Moreover, the smaller the magnetic permeability of a magnetic core is, the more easily the coupling coefficient is reduced. In this case, if the values of circuit devices are determined in the case where the coupling coefficient is considered as 1, an issue that it is difficult to obtain an originally expected attenuation will arise.

Therefore, in the noise suppressor according to the embodiment, while it is considered that the coupling coefficients k1 through k6 between the inductors are smaller than 1 in reality, in particular, on the basis of the condition that the coupling coefficients k1 through k6 are smaller than 1, the inductance L3 of the third inductor 23 is set to a value corresponding to the actual values of the coupling coefficients k1 through k6 so as to obtain a desired noise attenuation characteristic. Specific conditions for the inductance L3 will be described later.

Next, the functions of the noise suppressor will be described below.

At first, referring to FIG. 3, the principle of noise suppression operation by the noise suppressor will be described below. The inductances L1 and L2 of the first and the second inductors 21 and 22 are the same values, and the impedance of the first capacitor 31 is negligible. Likewise, the inductances L4 and L5 of the fourth and the fifth inductors 24 and 25 are the same values, and the impedance of the second capacitor 32 is negligible.

Firstly, the case where a common mode voltage Vi is applied to the terminals 1A and 1B will be described. In this case, when the common mode voltage Vi is applied between the first conductive wire 3 and the ground on a side closer to the first winding wire 11, the common mode voltage Vi with the same phase is applied between the second conductive wire 4 and the ground on a side closer to the fourth winding wire 14. The voltage Vi applied between the first conductive wire 3 and the ground is divided by the first inductor 21 and the third inductor 23 so as to generate a predetermined voltage V1 between both ends of the first inductor 21 and a predetermined voltage V3 between both ends of the first series circuit (the third inductor 23 and the first capacitor 31) in the same direction. The direction shown by an arrow in the drawing indicates a higher potential. The first inductor 21 and the second inductor 22 are magnetically coupled to each other, so the same voltage V2 as the voltage V1 is generated between both ends of the second inductor 22 according to the predetermined voltage V1 generated between both ends of the first inductor 21. One end of the first series circuit is connected between the first winding wire 11 and the second winding wire 12, so the direction of the voltage V2 generated between both ends of the second inductor 22 is opposite to the direction of the voltage V3 generated between both ends of the first series circuit, and the voltages cancel out each other. As a result, a voltage Vo between the first conductive wire 3 and the ground on a side closer to the second winding wire 12 is smaller than the voltage Vi applied to a side closer to the first winding wire 11.

Likewise, the voltage Vi applied between the second conductive wire 4 and the ground on a side closer to the fourth winding wire 14 is divided by the fourth inductor 24 and the third inductor 23 so as to generate a predetermined voltage V1 between both ends of the fourth inductor 24 and a predetermined voltage V3 between both ends of the second series circuit (the third inductor 23 and the second capacitor 32) in the same direction. The fourth inductor 24 and the fifth inductor 25 are magnetically coupled to each other, so the same voltage V2 as the voltage V1 is generated between both ends of the fifth inductor 25 according to the predetermined voltage V1 generated between both ends of the fourth inductor 24. One end of the second series circuit is connected between the fourth winding wire 14 and the fifth winding wire 15, so the direction of the voltage V2 generated between both ends of the fifth inductor 25 is opposite to the direction of the voltage V3 generated between both ends of the second series circuit, and the voltages cancel out each other. As a result, the voltage Vo between the second conductive wire 4 and the ground on a side closer to the fifth winding wire 15 is smaller than the voltage Vi applied to a side closer to the fourth winding wire 14.

Moreover, in the circuit, in the case where the common mode voltage Vo is applied to the terminals 2A and 2B, as in the case of the above description, the common mode voltage Vi generated in the terminals 1A and 1B is smaller than the common mode voltage Vo applied to the terminals 2A and 2B. Thus, common mode noise in a wide frequency range can be favorably suppressed through the use of a voltage generated in each inductor in the case where common mode noise is applied to the terminals 1A and 1B and in the case where common mode noise is applied to the terminals 2A and 2B.

A function in the case where the noise suppressor is in an ideal state will be described below.

In the noise suppressor, the ideal state means a state in which the inductances L1 through L5 of the inductors 21 and 25 are optimized assuming that the coupling coefficients k1 through k6 are 1. In particular, the ideal state means a state in which the inductances L1 and L2 of the first and the second inductors 21 and 22 and the inductances L4 and L5 of the fourth and the fifth inductors 24 and 25 are the same values L0, and the inductance L3 of the third inductor 23 is the same value L0.

In the ideal state, for example, in the case where the common mode voltage Vi is applied to the terminals 1A and 2B, voltages Vi/2 having the same absolute values in the same directions as the above-described voltages V1 and V3 are generated between both ends of the first inductor 21 and between both ends of the first series circuit (the third inductor 23 and the first capacitor 31). A voltage Vi/2 having the same absolute value as the voltage V2 is generated between both ends of the second inductor 22. As a result, the directions of the voltage V2 and the voltage V3 are opposite to each other, and the absolute values of the voltages V2 and V3 are the same, so they cancel out each other, thereby the voltage Vo between the first conductive wire 3 and the ground on the side closer to the second winding wire 12 is zero in principle. Likewise, in the case of the voltage Vi applied between the second conductive wire 4 and the ground on a side closer to the fourth L winding wire 14, the voltage Vo on a side closer to the fifth winding wire 15 is zero in principle. In the case where the common mode voltage Vo is applied to the terminals 2A and 2B, the common mode voltage Vi generated in the terminals 1A and 1B is zero in principle in a like manner.

In the noise suppressor according to the embodiment, as will be described later, even if the coupling coefficients k1 through k6 are out of the ideal state, and are smaller than 1, the inductance L3 of the third inductor 23 is set depending upon the values of the coupling coefficients k1 through k6, so an attenuation characteristic which is substantially the same as or similar to that in the ideal state can be obtained. Alternatively, when the resonance point is produced at an arbitrary frequency, a better characteristic than that in the ideal state can be obtained partially.

Figure 4:
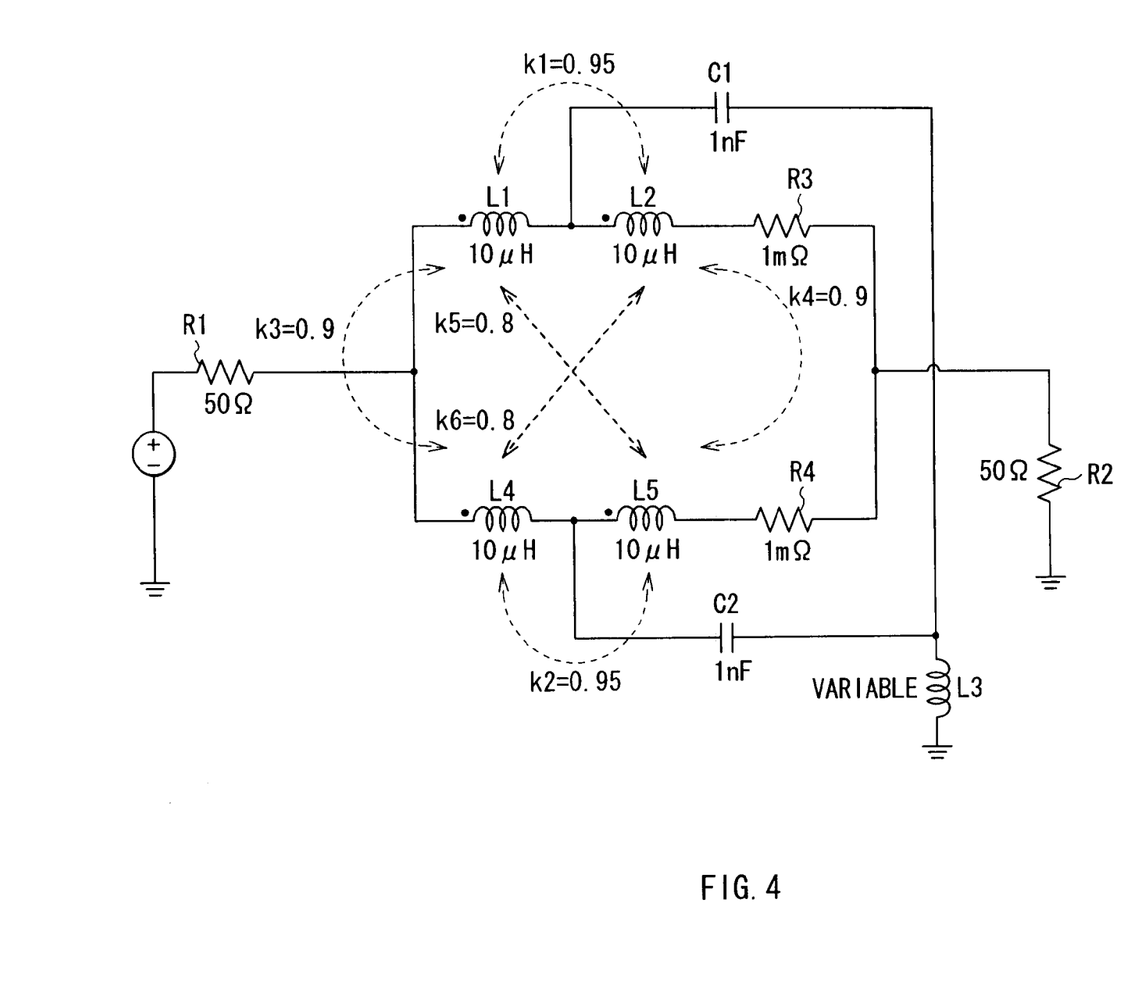
FIG. 4 is an illustration for describing circuit values used to calculate the attenuation characteristic of the noise suppressor according to the first embodiment of the invention.

Next, a change in the attenuation characteristic by the inductance L3 will be described in detail through the use of the following results of simulations. FIG. 4 shows an equivalent circuit of the noise suppressor used in the simulations. R1 and R2 are set as input/output impedances. Moreover, R3 and R4 are set as impedance components on the conductive wires. As shown in FIG. 4, the coupling coefficients are set as follows.

$k1=k2=0.95$
$k3=k4=0.9$
$k5=k6=0.8$

Moreover, the inductances L1 and L2 of the first and the second inductors 21 and 22 and the inductances L4 and L5 of the fourth and the fifth inductors 24 and 25 are set to the same values (L1, L2, L4 and L5=L0=10 μH).

In this case, the values of M1 through M5 are defined as follows.

$$M1=k1(L1 \cdot L2)^{1/2}=9.5 \text{ μH}$$

$$M2=k2(L4 \cdot L5)^{1/2}=9.5 \text{ μH}$$

$$M3=k3(L1 \cdot L4)^{1/2}=9.0 \text{ μH}$$

$$M4=k4(L2 \cdot L5)^{1/2}=9.0 \text{ μH}$$

$$M5=k5(L1 \cdot L5)^{1/2}=8.0 \text{ μH}$$

$$M6=k6(L2 \cdot L4)^{1/2}=8.0 \text{ μH}$$

Figure 5:
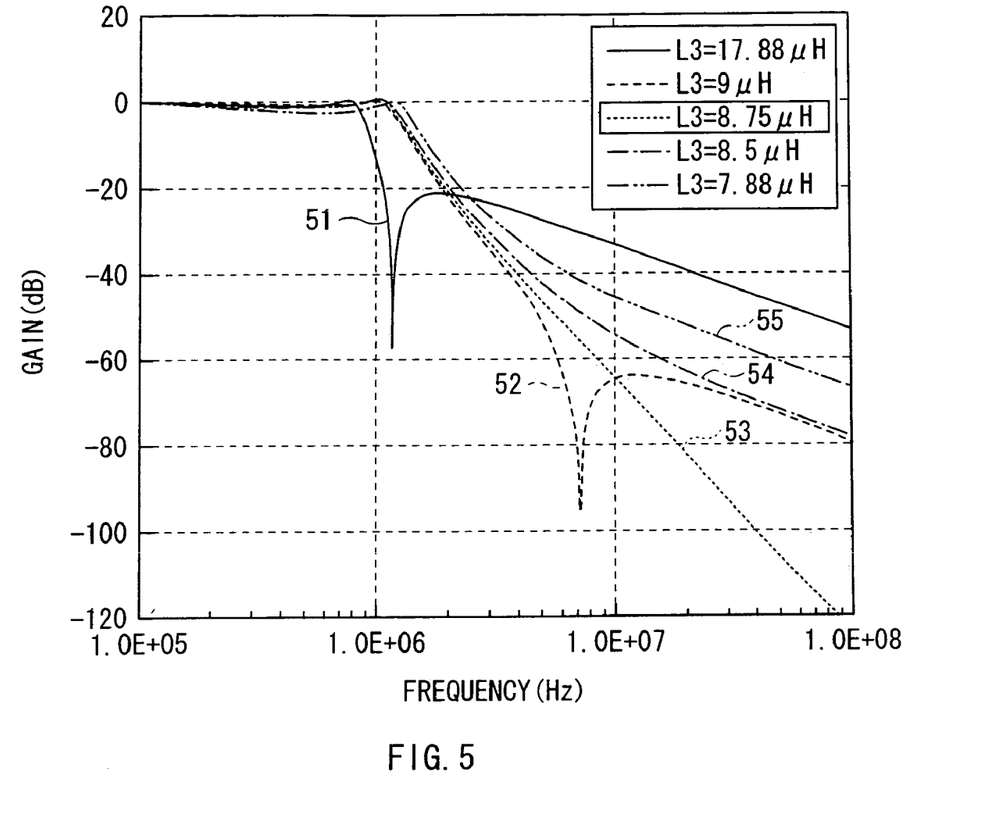
FIG. 5 is a plot showing simulation results of the attenuation characteristic of the noise suppressor according to the first embodiment of the invention.

The attenuation characteristic in the case where the inductance L3 of the third inductor 23 is variously changed under such circuit conditions is calculated. FIG. 5 shows the results of the simulations. The horizontal axis indicates frequency (Hz), and the vertical axis indicates gain (dB). The smaller the gain is, that is, the larger the absolute value of the gain in a negative direction is, the larger the noise attenuation becomes.

In FIG. 5, a line with a numeral 51, a line with a numeral 52, a line with a numeral 53, a line with a numeral 54 and a line with a numeral 55 show simulation results in the case of L3=17.88 μH, 9 μH, 8.75 μH, 8.5 μH and 7.88 μH, respectively.

F From the simulation results in FIG. 5, the following can be said about a relationship between the inductance L3 and the attenuation characteristic. The relationship are divided broadly into the following three conditions (A-1), (B-1) and (C-1) by the inductance. L3.

$$L3=(M1+M5)/2 \qquad \text{(A-1)}$$

In the simulations in FIG. 5, the condition (A-1) corresponds to the line with the numeral 53 (L3=8.75 μH). In this case, even if each coupling coefficient is less than 1, substantially the same attenuation characteristic as that in the ideal state can be obtained. The attenuation characteristic in the ideal state is not shown; however, a line in the ideal state roughly coincides with the line with the numeral 53. The ideal state in this case means the case of k1 through k6=1.0, and L3=L0=10 µH in the equivalent circuit shown in FIG. 4.

$$L3 > (M1+M5)/2 \quad (B\text{-}1)$$

In the simulations in FIG. 5, the condition (B-1) corresponds to the lines with the numerals 51 and 52 (L3>8.75 µH). In this case, a resonance point which does not exist in the ideal state appears. Then, a resonant frequency f0 is determined by the following equation.

$$f0 = 1/2\pi\sqrt{C(2 \cdot L3 - M1 - M5)}$$

In the above equation, $\sqrt{}$ is applied to C(2·L3−M1−M5). Moreover, C indicates the values of the capacitances C1 and C2 of the first and the second capacitors 31 and 32. Therefore, in this case, when the value of L3 is changed, the resonant frequency can be moved to any given frequency. In the case where the resonance point is arranged, in a higher frequency region than a cutoff frequency, a region in which the attenuation characteristic is better than that in the case of the ideal state is produced partially. In other words, it is obvious from FIG. 5 that in a higher frequency band than the cutoff frequency in which the characteristic coincides with the characteristic in the ideal state, a region where the attenuation characteristic is better than the characteristic in the ideal state is produced.

In this case, it is desirable that the maximum value of the inductance L3 satisfies the following condition because of a condition that it is desirable that the resonant frequency f0 determined by the above equation is equal to or higher than the cutoff frequency in the ideal state.

$$L3 \leq (L1+M1+M3+M5)(L2+M1+M4+M5)/2(L1+L2+2 \cdot M1+M3+M4+2 \cdot M5)+(M1+M5)/2$$

In the simulations in FIG. 5, the line with the numeral 51 shows a characteristic at the maximum value determined by the above equation (L3=17.88 µH).

$$L3 < (M1+M5)/2 \quad (C\text{-}1)$$

In the simulations in FIG. 5, the condition (C-1) corresponds to the lines with the numerals 54 and 55 (L3<8.75 µH). In this case, it is obvious from the attenuation characteristic in FIG. 5 that a characteristic similar to that in the ideal state is obtained, and in particular, substantially the same characteristic as that in the ideal state is shown until a certain state, and then the attenuation characteristic is degraded from a certain frequency or higher. Therefore, when the noise suppressor is used in substantially the same frequency range as that in the ideal state, there is a merit in setting L3 to the condition value.

In this case, when the simulation results are considered, it is desirable that the minimum value of the inductance L3 satisfies the following condition.

$$L3 \geq 0.9(M1+M5)/2$$

In the simulations in FIG. 5, the line with the numeral 55 shows a characteristic at the minimum value determined by this equation (L3=7.88 µH).

As described above, in the noise suppressor according to the embodiment, under a condition that the coupling coefficient between inductors is smaller than 1, circuit conditions under which a desired noise attenuation characteristic can be obtained are satisfied, so even if inductors are magnetically coupled to each other, a favorable attenuation characteristic can be obtained.

[Second Embodiment]

Next, a noise suppressor according to a second embodiment of the invention will be described below.

Figure 6:
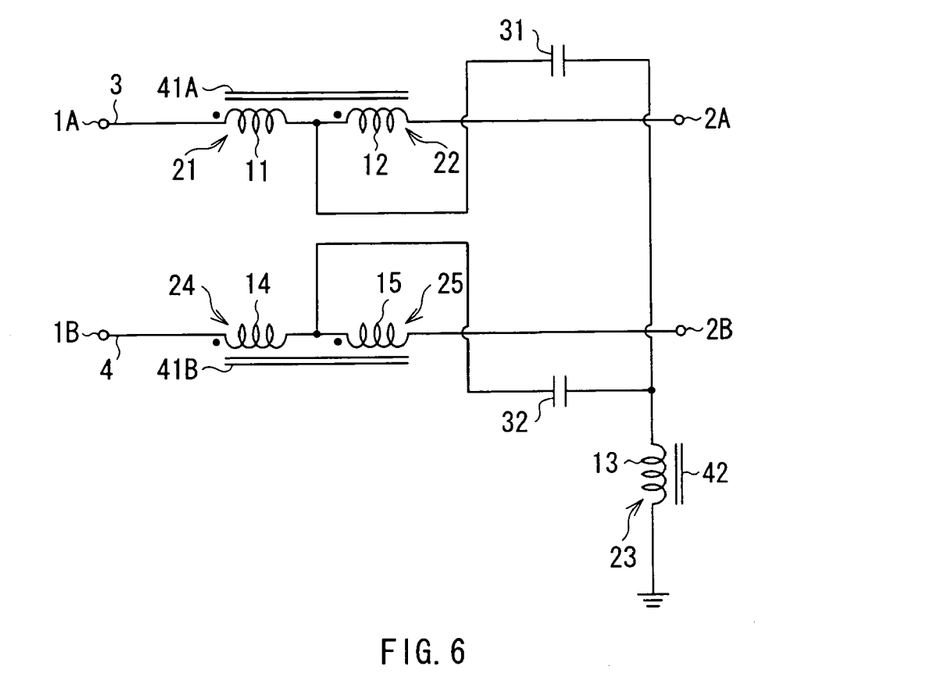
FIG. 6 is a circuit diagram of a noise suppressor according to a second embodiment of the invention.

FIG. 6 shows an example of the noise suppressor according to the embodiment. The embodiment relates to a circuit for common mode suppression as in the case of the first embodiment. In the embodiment, like components are denoted by like numerals as of the noise suppressor according to the first embodiment and will not be further described.

Compared to the noise suppressor according to the first embodiment of the invention shown in FIG. 1, in the noise suppressor, the coupling state of each inductor is magnetically separated between conductive wires. In other words, a pair of the first and the second inductors 21 and 22 on the first conductive wire 3 and a pair of the fourth and the fifth inductors 24 and 25 on the second conductive wire 4 are magnetically separated from each other. The noise suppressor includes two cores 41A and 41B instead of the core 41 in FIG. 1.

On the first conductive wire 3, the first and the second inductors 21 and 22 are formed of the first and the second winding wires 11 and 12 and the core 41A around which the first and the second winding wires 11 and 12 are commonly wound in each winding wire portion. Likewise, on the second conductive wire 4, the fourth and the fifth inductors 24 and 25 are formed of the fourth and the fifth winding wires 14 and 15 and the core 41B around which the fourth and the fifth winding wires 14 and 15 are wound in each winding wire portion. The inductors on the conductive wires are formed through the use of the cores 41A and 41B which are magnetically separated from each other, so the inductors are magnetically separated from each other. In the drawing, a black circle symbol shown in each winding wire indicates the polarity of the winding wire, that is, a winding direction. The polarities of the first and the second winding wires 11 and 12 are preferably in the same direction. Moreover, the polarities of the fourth and the fifth winding wires 14 and 15 are preferably in the same direction.

The inductances of the first and the second inductors 21 and 22 are preferably the same. Likewise, the inductances of the fourth and the fifth inductors 24 and 25 are preferably the same.

As long as inductors on the first conductive wire 3 are magnetically coupled to each other appropriately, the core 41A may be divided into two or more. Likewise, as long as the inductors on the second conductive wire 4 are magnetically coupled to each other appropriately, the core 41B may be divided into two or more. Moreover, the first and the second inductors 21 and 22 may be made of a single winding wire instead of separate winding wires. The fourth and the fifth inductors 24 and 25 may be made of a single winding wire instead of separate winding wires. In this case, one end of the first capacitor 31 and one end of the second capacitor 32 are connected to somewhere in the middle of the single winding wire (preferably the midpoint of the single winding wire).

Figure 7:
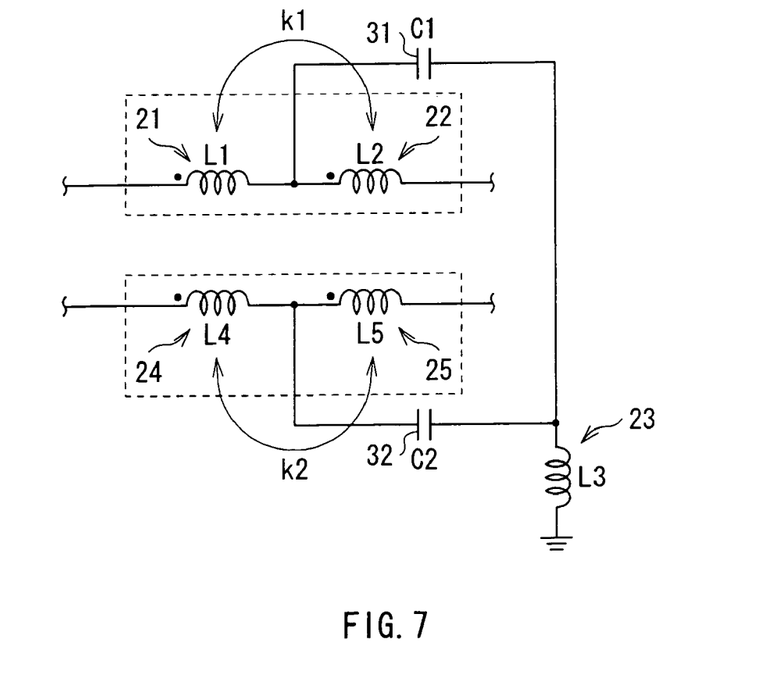
FIG. 7 is an illustration for describing coupling coefficients between inductors in the noise suppressor according to the second embodiment of the invention.

Referring to FIG. 7, the circuit conditions of the noise suppressor will be described below.

As shown in FIG. 7, the inductances of the inductors are L1 through L5 as in the case of the first embodiment. Likewise, the capacitances of the capacitors are C1 and C2. Moreover, the coupling coefficient between the first and the second inductors 21 and 22 is k1, and the coupling coefficient between the fourth and the fifth inductors 24 and 25 is k2. In the noise suppressor, the pair of the first and the second inductors 21 and 22 and the pair of the fourth and the fifth inductors 24 and 25 are magnetically separated between conductive wires, so k3 through k6 in the first embodiment is not taken into consideration.

It is preferable that the noise suppressor satisfies the following conditions, and a relationship between the inductors on the first conductive wire 3 and the inductors on the second conductive wire 4 is symmetric. Thereby, a circuit suitable for suppressing common mode noise can be obtained. However, it is not necessary to perfectly satisfy the following conditions, and there may be a difference by a manufacturing error.

L1=L4
L2=L5
k1=k2

In the noise suppressor, on each conductive wire, the first and the second inductors 21 and 22 is magnetically coupled to each other, and the fourth and the fifth inductors 24 and 25 are magnetically coupled to each other, and the ideal values of the coupling coefficients k1 and k2 are 1. However, in reality, it is difficult to achieve a coupling coefficient of 1.

Therefore, in the noise suppressor according to the embodiment, while it is considered that the coupling coefficients k1 and k2 between the inductors are smaller than 1 in reality, in particular, on the basis of the condition that the coupling coefficients k1 and k2 are smaller than 1, the inductance L3 of the third inductor 23 is set to a value corresponding to the actual values of the coupling coefficients k1 and k2 so as to obtain a desired noise attenuation characteristic. Specific conditions for the inductance L3 will be described later.

Next, the functions of the noise suppressor will be described below.

Figure 3:
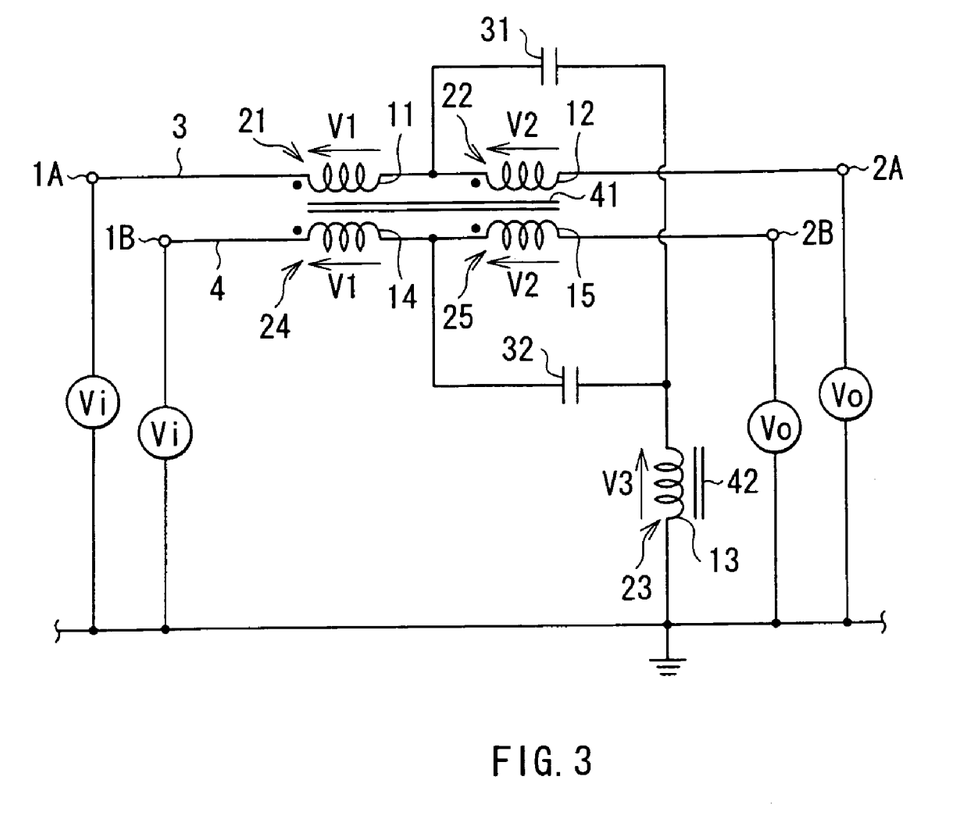
FIG. 3 is an illustration for describing operation of the noise suppressor according to the first embodiment of the invention.

The principle of noise suppression operation by the noise suppressor is the same as that in the circuit according to the first embodiment which is described referring to FIG. 3. In the noise suppressor, in an ideal state, common mode noise can be zero in principle.

In the noise suppressor, the ideal state means a state in which the inductances L1 through L5 of the inductors 21 and 25 are optimized assuming that the coupling coefficients k1 and k2 are 1. In particular, the ideal state means a state in which the inductances L1 and L2 of the first and the second inductors 21 and 22 and the inductances L4 and L5 of the fourth and the fifth inductors 24 and 25 are the same values L0, and the inductance L3 of the third inductor 23 is the same value L0.

In the noise suppressor according to the embodiment, as will be described later, even if the coupling coefficients k1 and k2 are out of the ideal state, and are smaller than 1, the inductance L3 of the third inductor 23 is set depending upon the values of the coupling coefficients k1 and k2, so an attenuation characteristic which is substantially the same as or similar to that in the ideal state can be obtained. Alternatively, when the resonance point is produced at an arbitrary frequency, a better characteristic than that in the ideal state can be obtained partially.

Figure 8:
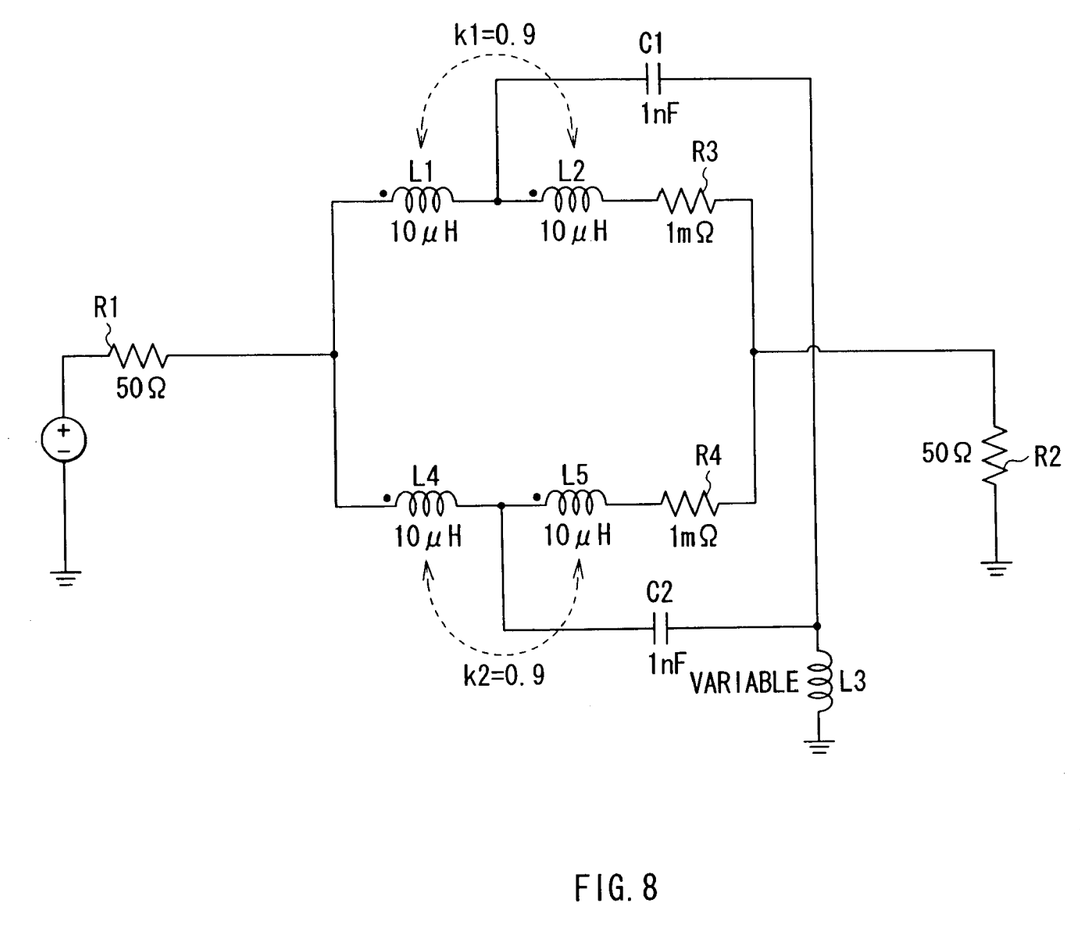
FIG. 8 is an illustration for describing circuit values used to calculate the attenuation characteristic of the noise suppressor according to the second embodiment of the invention.

Next, a change in the attenuation characteristic by the inductance L3 will be described in detail through the use of the following results of simulations. FIG. 8 shows an equivalent circuit of the noise suppressor used in the simulations. R1 and R2 are set as input/output impedances. Moreover, R3 and R4 are set as impedance components on the conductive wires. As shown in FIG. 8, the coupling coefficients are set as follows.

k1=k2=0.9

Moreover, the inductances L1 and L2 of the first and the second inductors 21 and 22 and the inductances L4 and L5 of the fourth and the fifth inductors 24 and 25 are set to the same values (L1, L2, L4 and L5=L0=10 µH).

In this case, the values of M1 and M2 are defined as follows.

$M1=k1(L1 \cdot L2)^{1/2}=9.0$ µH $M2=k2(L4 \cdot L5)^{1/2}=9.0$ µH

Figure 9:
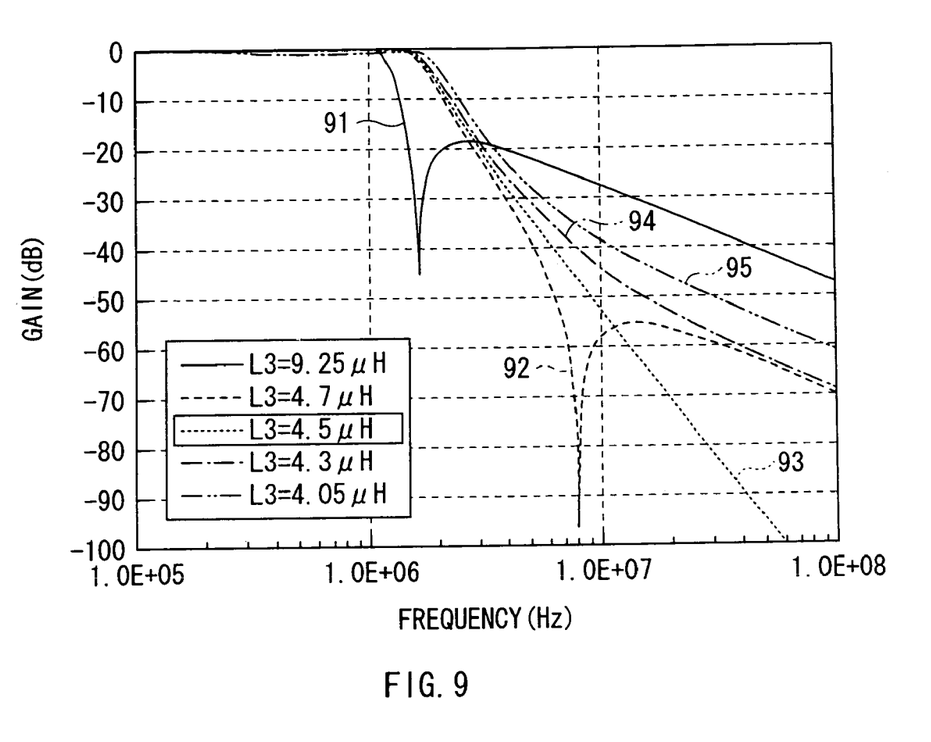
FIG. 9 is a plot showing simulation results of the attenuation characteristic of the noise suppressor according to the second embodiment of the invention.

The attenuation characteristic in the case where the inductance L3 of the third inductor 23 is variously changed under such circuit conditions is calculated. FIG. 9 shows the results of the simulations. The horizontal axis indicates frequency (Hz), and the vertical axis indicates gain (dB). The smaller the gain is, that is, the larger the absolute value of the gain in a negative direction is, the larger the noise attenuation becomes.

In FIG. 9, a line with a numeral 91, a line with a numeral 92, a line with a numeral 93, a line with a numeral 94 and a line with a numeral 95 show simulation results in the case of L3=9.25 µH, 4.7 µH, 4.5 µH, 4.3 µH and 4.05 µH, respectively.

From the simulation results in FIG. 9, the following can be said about a relationship between the inductance L3 and the attenuation characteristic. The relationship are divided broadly into the following three conditions (A-2), (B-2) and (C-2) by the inductance L3.

$L3=M1/2$ (A-2)

In the simulation in FIG. 9, the condition (A-2) corresponds to the line with the numeral 93 (L3=4.5 µH). In this case, even if each coupling coefficient is less than 1, substantially the same attenuation characteristic as that in the ideal state can be obtained. The attenuation characteristic in the ideal state is not shown; however, a line in the ideal state roughly coincides with the line with the numeral 93. The ideal state in this case means the case of k1 and k2=1.0, and L3=L0=10 µH in the equivalent circuit shown in FIG. 8.

$L3>M1/2$ (B-2)

In the simulations in FIG. 9, the condition (B-2) corresponds to the lines with the numerals 91 and 92 (L3>4.5 µH). In this case, a resonance point which does not exist in the ideal state appears. Then, a resonant frequency f0 is determined by the following equation.

$f0=1/2\pi\sqrt{C(2 \cdot L3-M1)}$

In the above equation, $\sqrt{\phantom{x}}$ is applied to $C(2 \cdot L3-M1)$. Moreover, C indicates the values of the capacitances C1 and C2 of the first and the second capacitors 31 and 32. Therefore, in this case, when the value of L3 is changed, the resonant frequency can be moved to any given frequency. In the case where the resonance point is arranged, in a higher frequency region than a cutoff frequency, a region in which the attenuation characteristic is better than that in the case of the ideal state is produced partially. In other words, it is obvious from FIG. 9 that in a higher frequency band than the cutoff frequency in which the characteristic coincides with the characteristic in the ideal state, a region where the attenuation characteristic is better than the characteristic in the ideal state is produced.

In this case, it is desirable that the maximum value of the inductance L3 satisfies the following condition because of a condition that it is desirable that the resonant frequency f0 determined by the above equation is equal to or higher than the cutoff frequency in the ideal state.

$$L3 \leq (L1+M1)(L2+M1)/2(L1+L2+2 \cdot M1)+M1/2$$

In the simulations in FIG. 9, the line with the numeral 91 shows a characteristic at the maximum value determined by the above equation (L3=9.25 µH).

$$L3 < M1/2 \qquad \text{(C-2)}$$

In the simulations in FIG. 9, the condition (C-2) corresponds to the lines with the numerals 94 and 95 (L3<4.5 µH). In this case, it is obvious from the attenuation characteristic in FIG. 9 that a characteristic similar to that in the ideal state is obtained, and in particular, substantially the same characteristic as that in the ideal state is shown until a certain state, and then the attenuation characteristic is degraded from a certain frequency or higher. Therefore, when the noise suppressor is used in substantially the same frequency range as that in the ideal state, there is a merit in setting L3 to the condition value.

In this case, when the simulation results are considered, it is desirable that the minimum value of the inductance L3 satisfies the following condition.

$$L3 \geq 0.9 \cdot M1/2$$

In the simulations in FIG. 9, the line with the numeral 95 shows a characteristic at the minimum value determined by this equation (L3=4.05 µH).

As described above, in the noise suppressor according to the embodiment, under a condition that the coupling coefficient between inductors is smaller than 1, circuit conditions under which a desired noise attenuation characteristic can be obtained are satisfied, so even if inductors are magnetically coupled to each other, a favorable attenuation characteristic can be obtained.

Obviously many modifications and variations of the present invention are possible in the light of the above teachings. It is therefore to be understood that within the scope of the appended claims the invention may be practiced otherwise than as specifically described.

What is claimed is:

1. A noise suppressor suppressing noise transmitted through a first conductive wire and a second conductive wire, the noise suppressor comprising:
   a first inductor and a second inductor which are inserted into the first conductive wire in series with each other and are magnetically coupled to each other;
   a first capacitor which has one end connected between the first inductor and the second inductor;
   a third inductor which has one end connected to the other end of the first capacitor and the other end connected to ground, and forms a first series circuit together with the first capacitor;
   a fourth inductor and a fifth inductor which are inserted into the second conductive wire in series with each other, and are magnetically coupled to each other; and
   a second capacitor which has one end connected between the fourth inductor and the fifth inductor and the other end connected to the one end of the third inductor, and forms a second series circuit together with the third inductor,
   wherein a pair of the first and the second inductors and a pair of the fourth and the fifth inductors are magnetically coupled to each other, and
   an inductance L3 of the third inductor satisfies the following condition:

$$L3=(M1+M5)/2 \qquad \text{(A-1)},$$

where $M1=k1(L1 \cdot L2)^{1/2}$, $M5=k5(L1 \cdot L5)^{1/2}$,

L1: inductance of the first inductor,
L2: inductance of the second inductor,
L5: inductance of the fifth inductor,
k1: coupling coefficient between the first and the second inductor, and
k5: coupling coefficient between the first and the fifth inductor.

2. A noise suppressor suppressing noise transmitted through a first conductive wire and a second conductive wire, the noise suppressor comprising:
   a first inductor and a second inductor which are inserted into the first conductive wire in series with each other and are magnetically coupled to each other;
   a first capacitor which has one end connected between the first inductor and the second inductor;
   a third inductor which has one end connected to the other end of the first capacitor and the other end connected to ground, and forms a first series circuit together with the first capacitor;
   a fourth inductor and a fifth inductor which are inserted into the second conductive wire in series with each other, and are magnetically coupled to each other; and
   a second capacitor which has one end connected between the fourth inductor and the fifth inductor and the other end connected to one end of the third inductor, and forms a second series circuit together with the third inductor,
   wherein a pair of the first and the second inductors and a pair of the fourth and the fifth inductors are magnetically coupled to each other, and
   an inductance L3 of the third inductor satisfies the following conditions:

$$L3>(M1+M5)/2 \qquad \text{(B-1), and}$$

$$L3 \leq (L1+M1+M3+M5)(L2+M1+M4+M5)/2(L1+L2+ \\ 2 \cdot M1+M3+M4+2 \cdot M5)+(M1+M5)/2,$$

where $M1=k1(L1 \cdot L2)^{1/2}$, $M3=k3(L1 \cdot L4)^{1/2}$, $M4=k4(L2 \cdot L5)^{1/2}$, $M5=k5(L1 \cdot L5)^{1/2}$, L1: inductance of the first inductor,
L2: inductance of the second inductor,
L4: inductance of the fourth inductor,
L5: inductance of the fifth inductor,
k1: coupling coefficient between the first and the second inductors,
k3: coupling coefficient between the first and the fourth inductor,
k4: coupling coefficient between the second and the fifth inductor, and
k5: coupling coefficient between the first and the fifth inductor.

3. A noise suppressor suppressing noise transmitted through a first conductive wire and a second conductive wire, the noise suppressor comprising:

a first inductor and a second inductor which are inserted into the first conductive wire in series with each other and are magnetically coupled to each other;

a first capacitor which has one end connected between the first inductor and the second inductor;

a third inductor which has one end connected to the other end of the first capacitor and the other end connected to ground, and forms a first series circuit together with the first capacitor;

a fourth inductor and a fifth inductor which are inserted into the second conductive wire in series with each other, and are magnetically coupled to each other; and a second capacitor which has one end connected between the fourth inductor and the fifth inductor and the other end connected to the one end of the third inductor, and forms a second series circuit together with the third inductor, wherein a pair of the first and the second inductors and a pair of the fourth and the fifth inductors are magnetically coupled to each other, and an inductance L3 of the third inductor satisfies the following conditions:

$$L3 < (M1+M5)/2 \quad \text{(C-1), and}$$

$$L3 \geq 0.9(M1+M5)/2,$$

where $M1 = k1(L1 \cdot L2)^{1/2}$, $M5 = k5(L1 \cdot L5)^{1/2}$,

L1: inductance of the first inductor,
L2: inductance of the second inductor,
L5: inductance of the fifth inductor,
k1: coupling coefficient between the first and the second inductor, and
k5: coupling coefficient between the first and the fifth inductor.

4. A noise suppressor suppressing noise transmitted through a first conductive wire and a second conductive wire, the noise suppressor comprising:

a first inductor and a second inductor which are inserted into the first conductive wire in series with each other and are magnetically coupled to each other;

a first capacitor which has one end connected between the first inductor and the second inductor;

a third inductor which has one end connected to the other end of the first capacitor and the other end connected to ground, and forms a first series circuit together with the first capacitor;

a fourth inductor and a fifth inductor which are inserted into the second conductive wire in series with each other, and are magnetically coupled to each other; and a second capacitor which has one end connected between the fourth inductor and the fifth inductor and the other end connected to the one end of the third inductor, and forms a second series circuit together With the third inductor, wherein a pair of the first and the second inductors and a pair of the fourth and the fifth inductors are magnetically separated from each other.

5. The noise suppressor according to claim 4, wherein an inductance L3 of the third inductor satisfies the following condition:

$$L3 = M1/2 \quad \text{(A-2)}$$

where $M1 = k1(L1 \cdot L2)^{1/2}$,

L1: inductance of the first inductor,
L2: inductance of the second inductor, and
k1: coupling coefficient between the first and the second inductor.

6. The noise suppressor according to claim 4, wherein an inductance L3 of the third inductor satisfies the following conditions:

$$L3 > M1/2 \quad \text{(B-2), and}$$

$$L3 \leq (L1+M1)(L2+M1)/2(L1+L2+2 \cdot M1) + M1/2,$$

where $M1 = k1(L1 \cdot L2)^{1/2}$,

L1: inductance of the first inductor,
L2: inductance of the second inductor, and
k1: coupling coefficient between the first and the second inductors.

7. The noise suppressor according to claim 4, wherein an inductance L3 of the third inductor satisfies the following conditions:

$$L3 < M1/2 \quad \text{(C-2), and}$$

$$L3 \geq 0.9 \cdot M1/2,$$

where $M1 = k1(L1 \cdot L2)^{1/2}$,

L1: inductance of the first inductor,
L2: inductance of the second inductor, and
k1: coupling coefficient between the first and the second inductors.

* * * * *